(12) United States Patent
Sakai (10) Patent No.: US 7,073,521 B2
(45) Date of Patent: Jul. 11, 2006

(54) SUBSTRATE PROCESSING APPARATUS COMPRISING RING-SHAPED MOTOR

(75) Inventor: Takamasa Sakai, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 278 days.

(21) Appl. No.: 10/241,281

(22) Filed: Sep. 10, 2002

(65) Prior Publication Data

US 2003/0056815 A1    Mar. 27, 2003

(30) Foreign Application Priority Data

Sep. 26, 2001    (JP)    ............................ P2001-294803

(51) Int. Cl.
*B08B 3/00*    (2006.01)

(52) U.S. Cl. ...................... 134/157; 134/902

(58) Field of Classification Search ................ 134/157, 134/153, 902; 310/52, 54, 57, 90, 112, 114, 310/266, 267, 268
See application file for complete search history.

(56) References Cited

U.S. PATENT DOCUMENTS

| | | | | |
|---|---|---|---|---|
| 4,641,978 | A * | 2/1987 | Kapich | 384/102 |
| 5,670,838 | A * | 9/1997 | Everton | 310/254 |
| 5,796,191 | A * | 8/1998 | Schwanda | 310/58 |
| 5,916,366 | A * | 6/1999 | Ueyama et al. | 118/52 |
| 6,115,867 | A * | 9/2000 | Nakashima et al. | 15/77 |
| 6,250,997 | B1 * | 6/2001 | Hatano et al. | 451/259 |
| 6,485,531 | B1 * | 11/2002 | Schob | 29/25.01 |
| 2002/0125775 | A1 * | 9/2002 | Detela | 310/54 |
| 2003/0025409 | A1 * | 2/2003 | Liu et al. | 310/90 |

FOREIGN PATENT DOCUMENTS

| | | |
|---|---|---|
| JP | 61-279401 | 12/1986 |
| JP | 64-47560 | 3/1989 |
| JP | 1-118224 | 8/1989 |
| JP | 3-14949 | 2/1991 |
| JP | 10-112453 | 4/1998 |
| JP | 10-70858 | 10/1998 |
| JP | 2000-135475 | 5/2000 |
| JP | 2000-183009 | 6/2000 |

OTHER PUBLICATIONS

Japanese Office Action issued Aug. 5, 2005.

* cited by examiner

*Primary Examiner*—Joseph L. Perrin
(74) *Attorney, Agent, or Firm*—Ostrolenk, Faber, Gerb & Soffen, LLP (57) ABSTRACT

In a substrate processing apparatus for performing a substrate processing with a substrate being rotated, a ring-shaped motor is provided and a water pipe, a drainpipe and gas supply pipes are connected to a stationary part of the motor covered with a rotating part thereof. A gas from the gas supply pipes is supplied between the stationary part and the rotating part of the motor, thereby making the rotating part rotatable with a mechanism of a static pressure gaseous bearing (and a mechanical rotary). A group of induction coils are provided in a ring shape, and the water pipe and the drainpipe are connected to a duct for cooling water formed in the stationary part along the group of induction coils. This constitution allows removal of heat generated by the group of induction coils, to thereby achieving an adequate high-speed rotation of the substrate.

18 Claims, 5 Drawing Sheets

VII — VII

FIG. 8

VIII — VIII

SUBSTRATE PROCESSING APPARATUS COMPRISING RING-SHAPED MOTOR

BACKGROUND OF THE INVENTION

1. Field of the Invention

The present invention relates to a substrate processing apparatus which performs a substrate processing with a substrate being rotated.

2. Description of the Background Art

Substrate processing apparatuses which perform a substrate processing by rotating semiconductor substrates or glass substrates (hereinafter, referred to as "substrates") and supplying the substrates with various processing solutions (including cleaning solution) have been conventionally used. In such a substrate processing apparatus, usually, a substrate is supported from a lower portion and a mechanism for supporting the substrate is connected to a rotation axis of a motor, to thereby rotate the substrate.

On the other hand, in order to achieve a high-level substrate processing by using a downsized apparatus at lower cost, a thin ring rotation mechanism has been proposed recently. Specifically, a rotation mechanism with no rotation axis which comprises a motor having a ring-shaped stationary part (stator) and a ring-shaped rotating part (rotor) has been proposed.

With recent upsizing of substrates and the necessity of high-speed rotation of the substrates in the processing, however, there arises some problems if a ring-shaped motor is manufactured with ordinary techniques. Specifically, it is necessary to upsize the ring-shaped motor with the upsizing of substrates and heat generation inside the motor ill affects bearing mechanisms such as a gaseous bearing and a rolling bearing of large diameters. As a result, the motor can not exercise its performance required for the substrate processing.

SUMMARY OF THE INVENTION

The present invention is intended for a substrate processing apparatus.

According to an aspect of the present invention, the substrate processing apparatus comprises a motor having a ring-shaped stationary part and a ring-shaped rotating part with a predetermined central axis as a center thereof, the rotating part rotating about the central axis; and a holding part provided on the rotating part, for holding the substrate, and in the apparatus, the stationary part comprises a group of induction coils in a ring shape, being supplied with multiphase alternating current; a duct for cooling water provided along the group of induction coils; and a gas supply line for supplying gas to a clearance between the rotating part and the stationary part to make the rotating part smoothly rotatable with a mechanism of a static pressure gaseous bearing, and the rotating part has a conductive member or a magnetic member having an endring which gains a rotating force by a traveling magnetic field caused along the group of induction coils.

In the substrate processing apparatus of the present invention, it is possible to achieve an adequate high-speed rotation of a substrate by cooling.

According to another aspect of the present invention, the substrate processing apparatus comprises a motor having a ring-shaped stationary part and a ring-shaped rotating part with a predetermined central axis as a center thereof, the rotating part rotating about the central axis; and a holding part provided on the rotating part, for holding the substrate, and in the apparatus, the motor has a plurality of rotating members which rotate between the stationary part and the rotating part to make the rotating part rotatable with respect to the stationary part, the stationary part comprises a group of induction coils in a ring shape, being supplied with multiphase alternating current; and a duct for cooling water provided along the group of induction coils, and the rotating part has a conductive member or a magnetic member having an endring which gains a rotating force by a traveling magnetic field caused along the group of induction coils.

In the substrate processing apparatus of the present invention, it is possible to achieve an adequate high-speed rotation of a substrate with a plurality of rotating members.

Preferably, the substrate processing apparatus further comprises a supply unit for supplying an upper surface and a lower surface of the substrate with processing solution.

According to still another aspect of the present invention, the substrate processing apparatus comprises a plurality of processing units, and in the apparatus, each of the plurality of processing units comprises a motor having a ring-shaped stationary part and a ring-shaped rotating part with a predetermined central axis as a center thereof, the rotating part rotating about the central axis; and a holding part provided on the rotating part, for holding the substrate, and the plurality of processing units are arranged so that at least part of adjacent ones are overlapped in a direction of central axes of the motors.

In the substrate processing apparatus of the present invention, it is possible to achieve an improvement of performance on footprint.

These and other objects, features, aspects and advantages of the present invention will become more apparent from the following detailed description of the present invention when taken in conjunction with the accompanying drawings.

DESCRIPTION OF THE PREFERRED EMBODIMENTS

1. The First Preferred Embodiment

Figure 1:
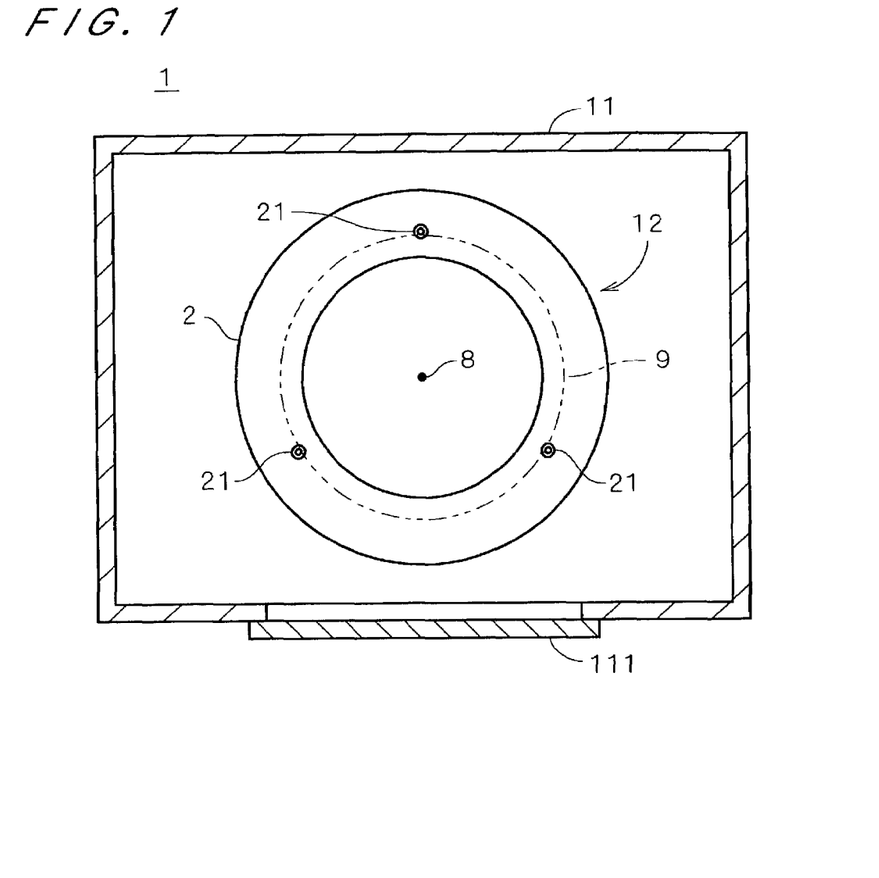
FIG. 1 is a plan view showing a substrate processing apparatus in accordance with a first preferred embodiment.
Figure 2:
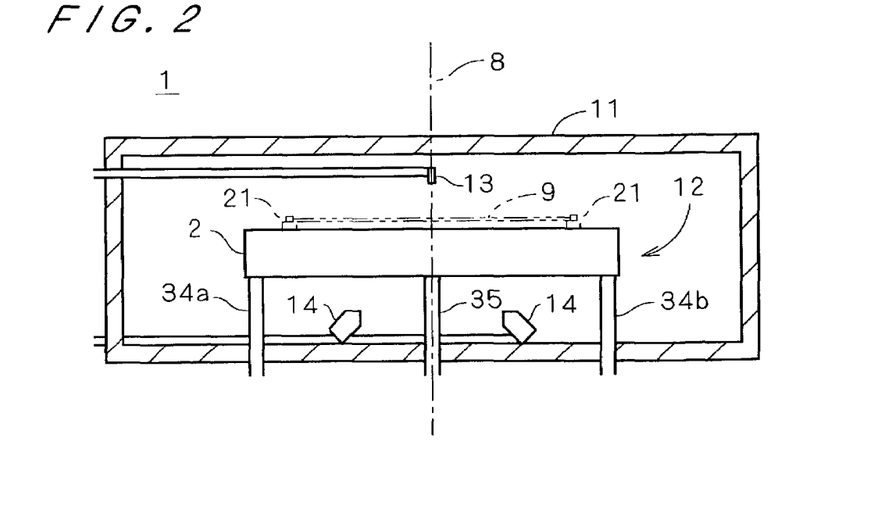
FIG. 2 is an elevation showing the substrate processing apparatus in accordance with the first preferred embodiment.

FIG. 1 is a plan view showing the inside of a substrate processing apparatus 1 in accordance with the first preferred embodiment of the present invention, and FIG. 2 is an elevation of the inside. As shown in FIG. 1, the substrate processing apparatus 1 has a ring-shaped motor 12 for rotating a semiconductor substrate 9 in a cover 11, and further has an upper-surface nozzle 13 for discharging processing solution to an upper surface of the substrate 9 and a lower-surface nozzle 14 for discharging processing solution (mainly cleaning solution) to a lower surface of the substrate 9 as shown in FIG. 2.

In the motor 12, a ring-shaped rotating part (rotor) 2 around a central axis 8 along a vertical direction forms the exterior and a stationary part (stator) 3 (see FIG. 3) supporting the rotating part 2 is covered with the rotating part 2. Holding pins 21 for holding the substrate 9 are disposed on the rotating part 2 and made disjoinable from an outer edge of the substrate 9 by a not-shown mechanism (e.g., a mechanism in which the holding pins 21 are moved by an external driving system when the rotating part 2 is sat at a predetermined position, a mechanism in which the holding pins 21 are moved by utilizing a magnetic force of an external magnet, a mechanism in which the holding pins 21 are moved by external gas pressure, and the like). The cover 11 has a gate member 111 to provide an opening for loading or unloading the substrate 9, and when the substrate 9 goes through the opening and is disposed between the holding pins 21, the holding pins 21 come into contact with the outer edge of the substrate 9 to hold the substrate 9.

Figure 3:
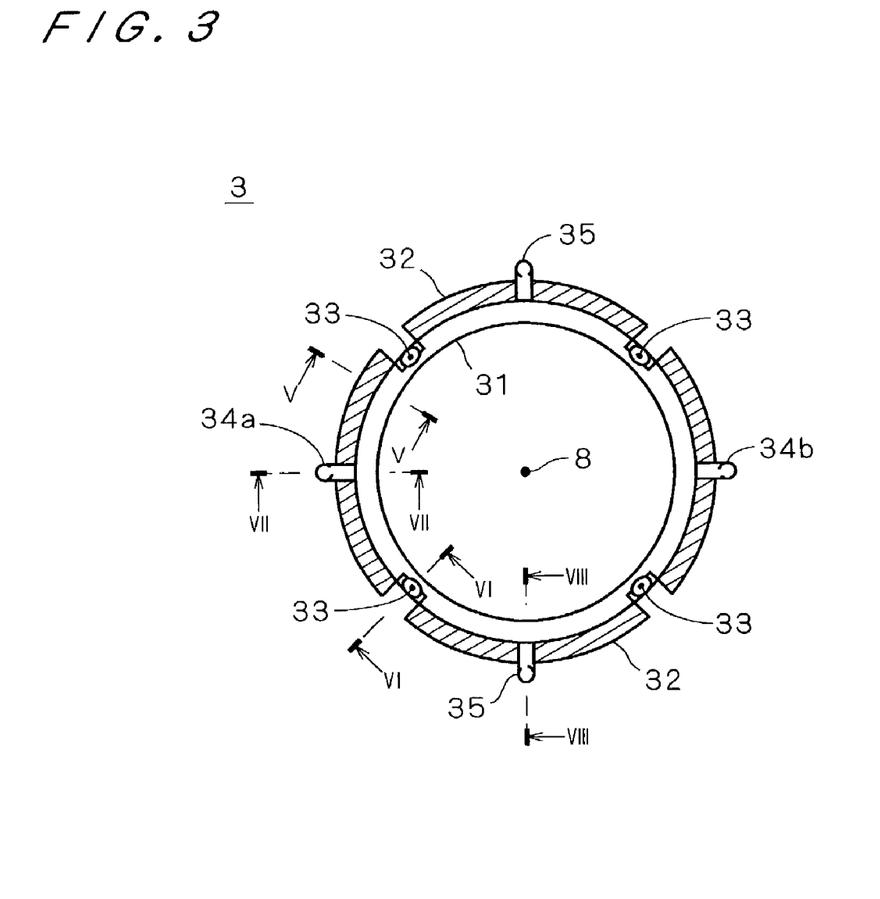
FIG. 3 is a plan view showing a stationary part.

FIG. 3 is a plan view showing a state of the stationary part 3 when the rotating part 2 is removed from the motor 12. The stationary part 3 has a ring shape around the central axis 8 and the rotating part 2 rotates along the stationary part 3. Specifically, as shown in FIGS. 1 and 2, the rotating part 2 rotates about the central axis 8 of the ring-shaped motor 12, thereby rotating the substrate 9 in a plane parallel to its main surface.

At this time, the upper-surface nozzle 13 discharges the processing solution to perform a processing of the upper surface of the substrate 9 and the lower-surface nozzle 14 discharges the processing solution to perform a processing, such as cleaning, of the lower surface of the substrate 9. Thus, providing the ring-shaped motor 12 in the substrate processing apparatus 1 makes it possible to perform a processing of the upper surface and the lower surface of the substrate 9 without changing the attitude (i.e., the normal direction to the surface) of the substrate 9.

Figure 4:
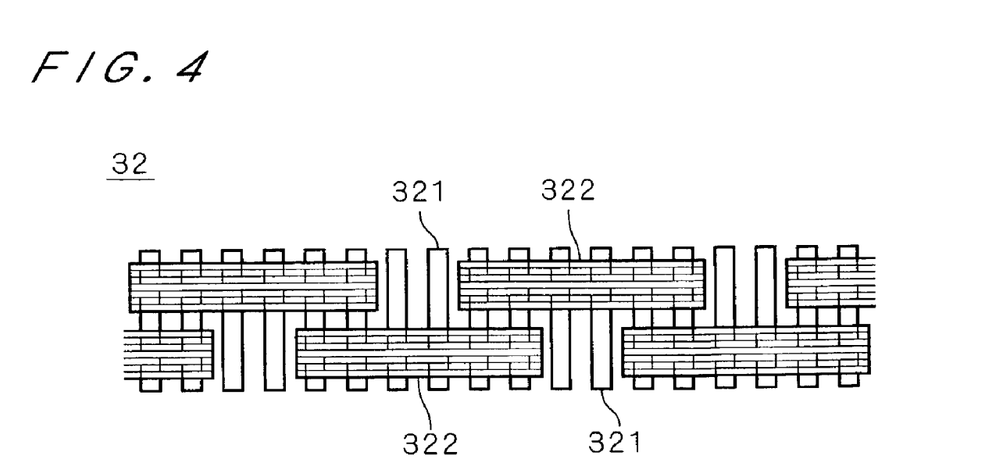
FIG. 4 is a view showing a relation between magnetic cores and coils.

As shown in FIG. 3, a group of induction coils 32 (for convenience of illustration, hatched in the figure) are provided in a ring shape (exactly speaking, substantially in a ring) on the circumference of a main body 31 which is a body of the stationary part 3. FIG. 4 is a view showing a relation between magnetic cores 321 and coils 322 as the group of induction coils 32 are viewed from the central axis 8. A lot of magnetic cores 321 are disposed in a ring shape and each of the magnetic cores 321 is formed of many flat rolled silicon steel chips which are layered one on another. The magnetic cores 321 are wound with the coils 322 made of enameled wire so that the coils 322 should be overlapped vertically on a third of the magnetic cores 322. With this structure, traveling magnetic fields are generated along the group of induction coils 32 when three-phase alternating current is sequentially given to the plurality of coils 322. As a result, eddy currents are produced in conductive members discussed later on the side of the rotating part 2 and a rotating force is given to the rotating part 2 according to the principle of a linear motor.

When two-phase alternating current is given to the group of induction coils 32, the coils 322 are so disposed as to be overlapped on half of the magnetic cores 321. Further, there may be another structure if multiphase alternating current is given to the group of induction coils 32 to generate traveling magnetic fields.

As shown in FIG. 3, a plurality of miniature bearings 33 which are rolling bearings for receiving a radial load are disposed on the main body 31 of the stationary part 3, and an inner ring of each miniature bearing 33 is fixed to the main body 31. An outer ring thereof comes into contact with the rotating part 2. A water pipe 34a and a drainpipe 34b for carrying a cooling water are connected to the main body 31 and gas supply pipes 35 for supplying nitrogen gas (hereinafter, referred to simply as "gas") between the stationary part 3 and the rotating part 2 is also connected thereto. As shown in FIG. 2, the water pipe 34a, the drainpipe 34b and the gas supply pipes 35 extend downward and are connected to a cooling apparatus and a gas supplying apparatus outside this apparatus. The stationary part 3 is supported in the cover 11 by the water pipe 34a, the drainpipe 34b and the gas supply pipes 35. Naturally, the stationary part 3 may be fixed in the cover 11 by other members.

Figure 5:
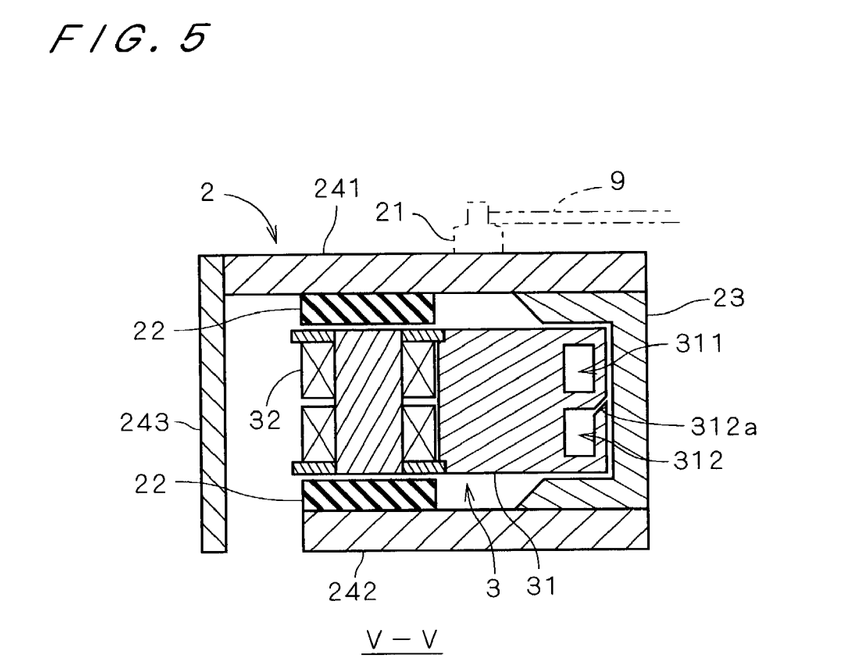
FIG. 5 shows a cross section of a motor at the position indicated by the arrow V—V of FIG. 3.

FIG. 5 shows a cross section of the motor 12 at the position indicated by the arrow V—V of FIG. 3. The rotating part 2 has a shape to cover the stationary part 3 and has a structure where an ring-shaped upper surface member 241 and a ring-shaped lower surface member 242 are fixed on an upper portion and a lower portion of an inner ring member 23 which is an inner side wall and an outer ring member 243 which is an outer side wall is fixed on the upper surface member 241.

The traveling magnetic fields generated by the group of induction coils 32 are found on both the upper surface side and the lower surface side of the stationary part 3, and conductor plates 22 are fixed on portions of the upper surface member 241 and the lower surface member 242 opposed to an upper portion and a lower portion of the group of induction coils 32, respectively. Specifically, the conductive members receiving a force caused by the traveling magnetic fields are provided separately on a portion opposed to one side of the group of induction coils 32 and a portion opposed to the other side thereof with respect to the direction of the central axis 8 (vertical direction). With this structure, two groups of traveling magnetic fields generated in the upper portion and the lower portion of the group of induction coils 32 achieve an efficient rotation of the rotating part 2.

In the main body 31 of the stationary part 3, a duct 311 for cool water and a gas supply line 312 are formed along the group of induction coils 32, and very small openings 312a are formed, leading from the gas supply line 312 to the inner surface of the main body 31. Through these openings, gas is supplied to a very small clearance between the inner surfaces of the stationary part 3 (including upper and lower surfaces near the inner surface) and surfaces of the inner ring member 23 opposed to these inner surfaces.

Figure 6:
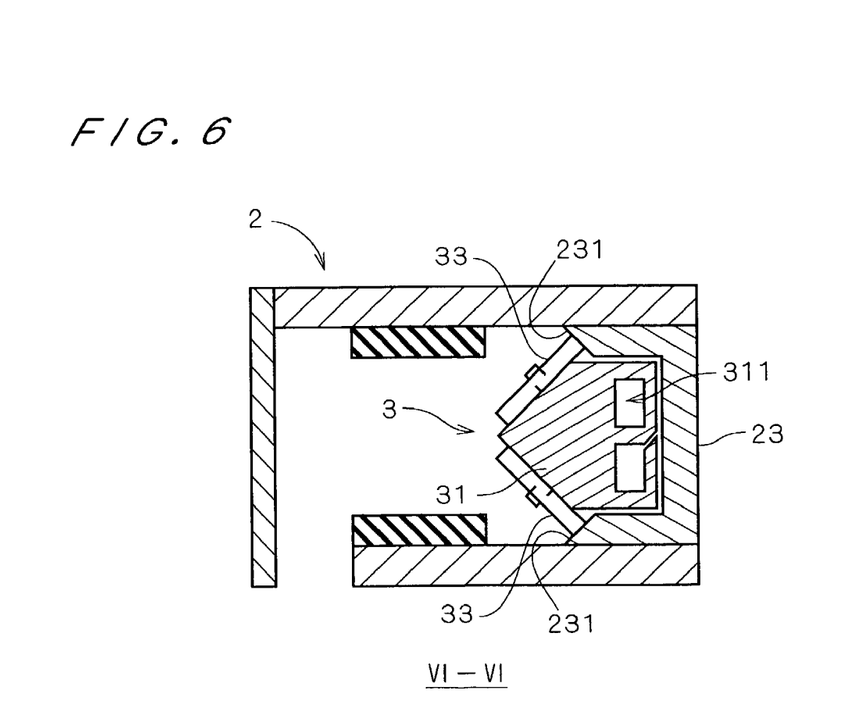
FIG. 6 shows a cross section of the motor at the position indicated by the arrow VI—VI of FIG. 3.

FIG. 6 shows a cross section of the motor 12 at the position indicated by the arrow VI—VI of FIG. 3, and specifically shows a cross section at a mounting position of the miniature bearings 33. A vertically-provided pairs of pines for fixing the miniature bearings 33 are projected from the main body 31 of the stationary part 3, into which the inner rings of the miniature bearings 33 are fitted. The inner ring member 23 of the rotating part 2 has a section which is convex towards the central axis 8 and upper and lower ends thereof outward with respect to the central axis 8 each form a sloped surface 231 which comes into contact with the outer rings of the miniature bearings 33. With this structure, the upper and lower miniature bearings 33 constrain the rotating part 2 both in a radial direction and in a thrust direction.

The motor 12 uses a bearing having a diameter of 20 mm which ensures a high-speed rotation of 70,000 rpm or more as the miniature bearing 33. In this case, when the diameter of a circle that the miniature bearing 33 makes during one rotation of the rotating part 2 is 380 mm, it is possible to rotate the substrate 9 at 3,600 rpm or more.

Figure 7:
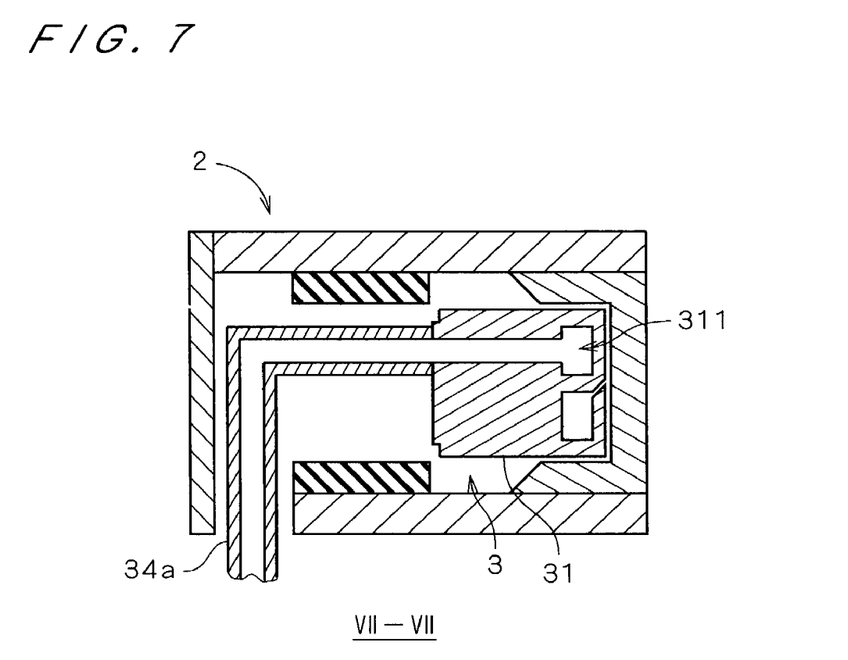
FIG. 7 shows a cross section of the motor at the position indicated by the arrow VII—VII of FIG. 3.

FIG. 7 shows a cross section of the motor 12 at the position indicated by the arrow VII—VII of FIG. 3, and specifically shows a cross section at the position of the water pipe 34*a*. The water pipe 34*a* is connected to the duct 311 for cooling water inside the main body 31. The duct 311 is formed inside the ring-shaped main body 31 and the drainpipe 34*b* is also connected to the duct 311. Cooling water is supplied from the water pipe 34*a* and drained from the drainpipe 34*b*, to cool the whole circumference of the stationary part 3.

With this cooling water, the heat generated by the group of induction coils 32 and the heat generated by the miniature bearings 33 are mainly removed. Specifically, the heat generated by the group of induction coils 32 is removed from the duct 311 through the main body 31 as shown in FIG. 5 and the heat generated by the miniature bearings 33 which perform high-speed rotation is also removed from the duct 311 through the main body 31.

Figure 8:
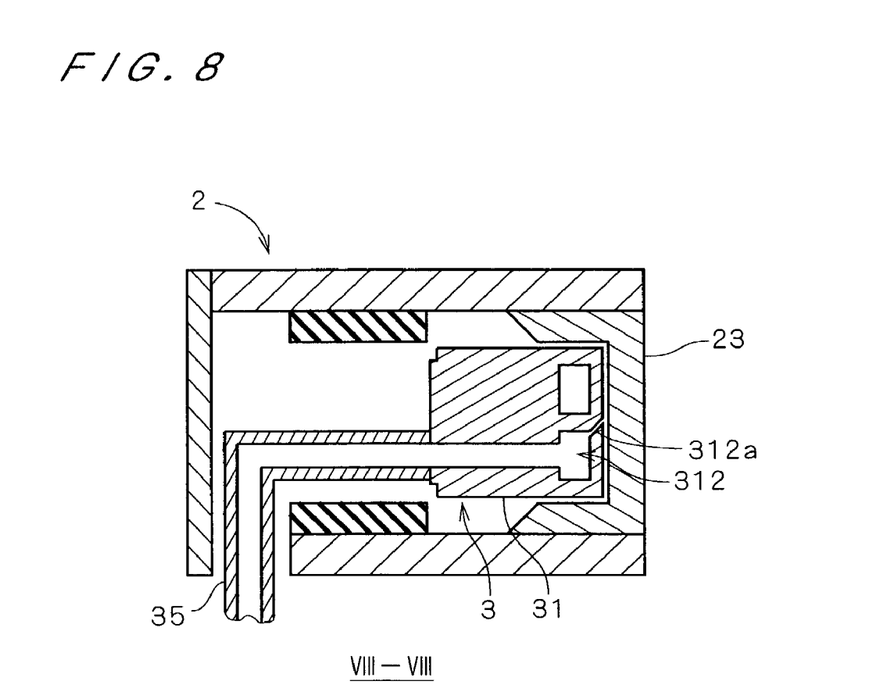
FIG. 8 shows a cross section of the motor at the position indicated by the arrow VIII—VIII of FIG. 3.

FIG. 8 shows a cross section of the motor 12 at the position indicated by the arrow VIII—VIII of FIG. 3, and specifically shows a cross section at the position of the gas supply pipe 35. The gas supply pipe 35 is connected to the gas supply line 312 inside the main body 31 of the stationary part 3. The gas supply line 312 is provided with a lot of very small openings 312*a* to supply gas to the clearance between the inner surface of the main body 31 and the inner ring member 23 as discussed earlier. Therefore, a jet of gas from the gas supply line 312 exerts a force to move the stationary part 3 and the rotating part 2 away from each other.

Though the structure to supply gas to the clearance between the stationary part 3 and the rotating part 2 is the same as that of a mechanism of a static pressure gaseous bearing, in the motor 12, the supply of gas works to aid the rotation mechanism of the miniature bearings 33 (in other words, to relieve load or oscillation on the miniature bearings 33) since the rotating part 2 is supported by the miniature bearings 33. Therefore, it is not necessary that the clearance between the main body 31 of the stationary part 3 and the inner ring member 23 of the rotating part 2 should be a very small clearance with as high accuracy as in the mechanism of a static pressure gaseous bearing.

The substrate processing apparatus 1 in accordance with the first preferred embodiment has been discussed above, and the first preferred embodiment allows downsizing of the substrate processing apparatus 1 since the vertical size of the substrate processing apparatus 1 is markedly reduced by using the ring-shaped motor 12. Further, since the duct 311 for cooling water is provided inside the stationary part 3, the heat generated by the group of induction coils 32 and the miniature bearings 33 can be removed. This suppresses expansion of the stationary part 3, thereby achieving an adequate high-speed rotation of even a large-sized substrate 9.

Moreover, in the motor 12, since the rotating part 2 is supported by the miniature bearings 33 and besides, gas is supplied to the clearance between the stationary part 3 and the rotating part 2, it is possible to relieve the load on the miniature bearings 33. Furthermore, the supply of gas prevents the processing solution from entering the clearance between the stationary part 3 and the rotating part 2 and using nitrogen gas as the gas to be supplied prevents corrosion of surfaces between the stationary part 3 and the rotating part 2 and that of the miniature bearings 33.

Though a force is exerted on the conductor plates 22 which are conductive members (i.e., portions of a conductive member) by the traveling magnetic fields generated by the group of induction coils 32 in the motor 12 discussed above, the conductor plates 22 may be magnetic members (i.e., portions of a magnetic member) having endrings. Specifically, the conductor plate 22 may be a member in which a strip-like silicon steel plate which is a magnetic member is coiled and the endring made of copper or the like is buried in a groove which is formed in a surface of the plate opposed to the group of induction coils 32. Since the magnetic member having the endring efficiently receives the force from the traveling magnetic field, it is possible to improve the efficiency of rotation of the motor 12. Further, instead of the conductor plate 22, a structure in which a magnetic member having an endring and a conductor plate are sequentially layered from the side of the stationary part 3 may be used.

2. The Second Preferred Embodiment

Though the rotating part 2 is supported rotatably on the stationary part 3 by the miniature bearings 33 and the mechanism having almost the same function as the mechanism of a static pressure gaseous bearing in the first preferred embodiment, it is possible to eliminate the necessity of supplying the gas to the clearance between the stationary part 3 and the rotating part 2 by improving machine-processing accuracy at a portion of the inner ring member 23 which comes into contact with the miniature bearings 33.

Figure 9:
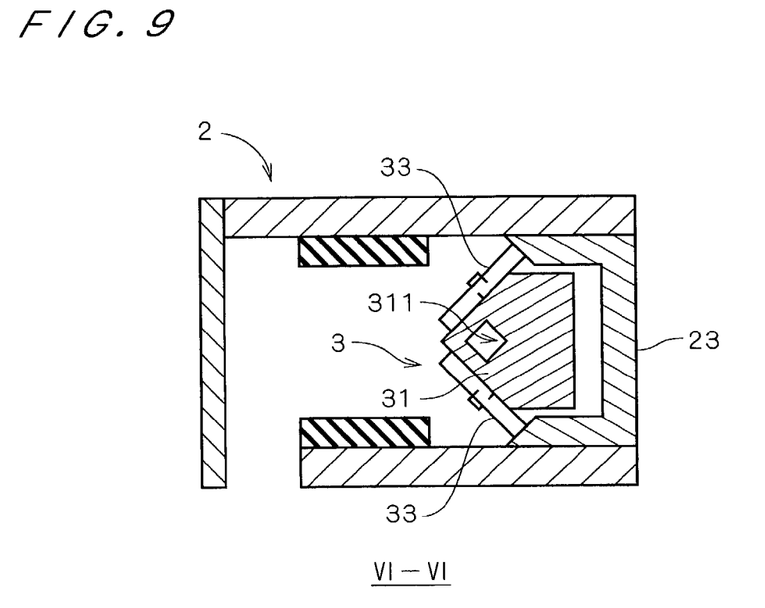
FIG. 9 shows a cross section of a motor in accordance with a second preferred embodiment.

FIG. 9 shows a cross section showing an exemplary case where the rotating part 2 is supported on the stationary part 3 only by the miniature bearings 33, corresponding to the case of the first preferred embodiment shown in FIG. 6. The cross-sectional structure of other portions of the motor 12 is basically the same as that of the first preferred embodiment except that the structure to supply the gas is omitted and the position of the duct 311 is changed.

In the motor of FIG. 9, since the clearance between the main body 31 of the stationary part 3 and the inner ring member 23 of the rotating part 2 does not function as the mechanism of a static pressure gaseous bearing, high accuracy is not required for the clearance therebetween. Further, though it is preferable in the first preferred embodiment that the duct 311 for cooling water should be provided near the clearance so as to prevent the ill-effect of heat expansion since the clearance between the main body 31 and the inner ring member 23 is small, the duct 311 may be provided adjacently to the group of induction coils 32 and the miniature bearings 33 which generate heat in the motor of FIG. 9. In other words, the duct 311 is formed on the side of circumference of the main body 31. This achieves an efficient cooling.

Thus, the rotating part 2 may be supported only by the miniature bearings 33, and in this case, the design of the duct 311 is conveniently changed, considering that the rotating part 2 is supported only by the miniature bearings 33. This achieves an adequate high-speed rotation of the substrate 9.

3. The Third Preferred Embodiment

Figure 10:
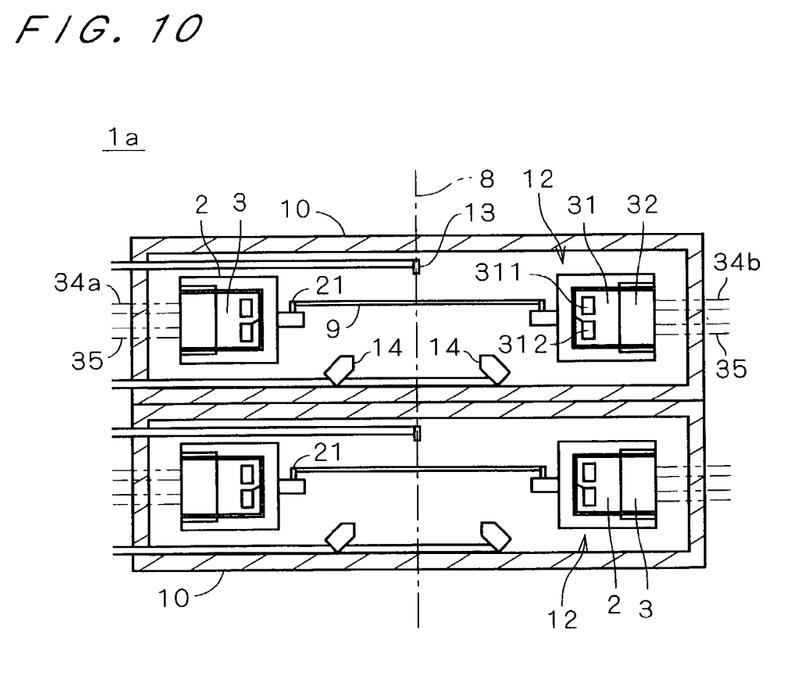
FIG. 10 is a cross section of a substrate processing apparatus in accordance with a third preferred embodiment.

The rotating part 2 of the ring-shaped motor 12 of the first preferred embodiment may be made smoothly rotatable only by a mechanism of a static pressure gaseous bearing. FIG. 10 is a cross section of a substrate processing apparatus 1*a* consisting of substrate processing units 10 which are so vertically layered as to share the central axis 8, in each of which the rotating part 2 is supported only by the mechanism of a static pressure gaseous bearing. In FIG. 10, cross sections of details are shown without being hatched.

Each substrate processing unit 10 of FIG. 10 has basically the same structure as that of the substrate processing apparatus 1 of the first preferred embodiment except that the motor 12 has no miniature bearing 33, the water pipe 34a, the drainpipe 34b and the gas supply pipes 35 extend in a horizontal direction and the substrate 9 is held by the holding pins 21 at the height between an upper surface and a lower surface of the rotating part 2, and the constituent elements identical to those of the first preferred embodiment are represented by the same reference signs.

In the substrate processing unit 10, since the rotating part 2 is supported by the mechanism of a static pressure gaseous bearing, the clearance between the stationary part 3 and the rotating part 2 (particularly, the clearance between the inner surface of the main body 31 and the rotating part 2 to which the gas is supplied from the gas supply line 312) should be formed with high accuracy. This needs that the heat generated by the group of induction coils 32 should not affect the clearance, and the duct 311 for cooling water should be provided between the group of induction coils 32 and the clearance along the group of induction coils 32. This structure allows the heat generated by the group of induction coils 32 in high-speed rotation to be properly removed and thereby prevents troubles of the mechanism of the static pressure gaseous bearing. As a result, it is possible to achieve an adequate high-speed rotation of the substrate 9.

Further, in the substrate processing unit 10, since the pipes connected to the stationary part 3 are led in the horizontal direction and the substrate 9 is held at the height between the upper surface and the lower surface of the rotating part 2, it is possible to suppress the height of the substrate processing unit 10 to very low. This achieves the substrate processing apparatus 1a in which the substrate processing units 10 are vertically layered as shown in FIG. 10 and allows improvement of performance on the footprint. Furthermore, since the processing solution is sprayed to the substrate 9 from the upper-surface nozzle 13 and the lower-surface nozzle 14 like in the first preferred embodiment, it is possible to efficiently perform a processing of the upper surface and the lower surface of the substrate 9 without changing the attitude of the substrate 9.

4. Variations

Though the preferred embodiments of the present invention have been discussed above, the present invention is not limited to the above-discussed preferred embodiments and allows various variations.

Though the substrate 9 is a semiconductor substrate in the above preferred embodiments, the substrate 9 may be a glass substrate for flat panel display and the like. Further, the substrate processing apparatus 1 may perform any processing only if the processing is done with the substrate 9 being rotated.

The mechanism to hold the substrate 9 is not limited to a mechanical chuck, and the substrate 9 may be held in any manner only if the substrate 9 can be held.

Though the groups of induction coils 32 of FIG. 3 are separately disposed at a plurality of positions, these are arranged perfectly in a ring shape. The group of induction coils 32 may generate the magnetic fields in a direction perpendicular to the central axis 8, instead of generating the magnetic fields in parallel to the central axis 8. In this case, the conductor plates 22 and the magnetic members having the endrings are arranged along an outer surface and/or an inner surface of the stationary part 3.

Though the mechanism of a static pressure gaseous bearing is provided between a portion having an angulate rough "C" shape opening outward from the central axis 8 (having a rectangular shape without one side) and the surface of the stationary part 3 in the first and third preferred embodiments, other shape may be adopted if it can constrain the rotating part 2 both in the radial direction and in the thrust direction.

For example, the mechanism of a static pressure gaseous bearing may be provided between a portion of the rotating part 2 having a lateral rough "U" shape opening inward with respect to the central axis 8 and the stationary part 3, and further may be provided between a portion of the rotating part 2 having a lateral rough "V" shape (having a shape with vertically-symmetrical sloped surfaces) or an arc portion thereof and the stationary part 3. In other words, the clearance between the stationary part 3 and the rotating part 2 corresponding to the mechanism of a static pressure gaseous bearing has a shape which is convex or concave towards the central axis 8, to thereby serve as a bearing mechanism to constrain the rotating part 2 both in the radial direction and in the thrust direction.

Though the inner rings of the miniature bearings 33 are fixed to the stationary part 3 in the above preferred embodiments, there may be a structure where the inner rings are fixed to the rotating part 2 and the outer rings come into contact with the stationary part 3. The members rotating between the stationary part 3 and the rotating part 2 are not limited to the miniature bearings 33 but may be steel balls or cylindrical members. In other words, a bearing of large diameter may be provided between the stationary part 3 and the rotating part 2. It goes without saying, however, that using the miniature bearings 33 eliminates the necessity of manufacturing a bearing of large diameter and allows easy design of a mechanism to rotate the rotating part 2.

Though the substrate processing units 10 are so layered as to share the central axis 8 in the third preferred embodiment, the substrate processing units 10 may be layered so that at least part of adjacent ones can be overlapped with respect to the rotation axis of the motor. In other words, providing a plurality of pairs of motors 12 and holding pins 21 so that adjacent ones can be overlapped with respect to the direction of the central axis 8 allows improvement of performance of the substrate processing apparatus 1a on the footprint.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for processing a substrate, comprising:
    a motor having a ring-shaped stationary part and a ring-shaped rotating part with a predetermined central axis as a center thereof, said rotating part rotating about said central axis; and
    a holding part provided on said rotating part, for holding said substrate,
    wherein said stationary part comprises:
    a group of induction coils in a ring shape, for being supplied with multiphase alternating current;
    a duct for cooling water provided along said group of induction coils;

a gas supply line for supplying gas to a clearance between said rotating part and said stationary part to make said rotating part smoothly rotatable with a mechanism of a static pressure gaseous bearing; and a plurality of rotating members which rotate between said stationary part and said rotating part to make said rotating part rotatable with respect to said stationary part, and said rotating part has a conductive member or a magnetic member having an endring which gains a rotating force by a traveling magnetic field caused along said group of induction coils; wherein said rotating part has an inner ring member whose section has a three-sided rectangular shape and opens outward from said central axis, said clearance is provided between inner surfaces including upper and lower surfaces near an inner side surface of said stationary part and surfaces of said inner ring member opposed to said inner surfaces, said gas supply line supplies gas from at least said inner side surface of said stationary part to said clearance, and said group of induction coils are located outside of said clearance with respect to said central axis.

2. The substrate processing apparatus according to claim 1, wherein
said clearance corresponding to said mechanism of a static pressure gaseous bearing has a portion which is convex or concave towards said central axis.

3. The substrate processing apparatus according to claim 1, wherein
said duct is provided between said group of induction coils and said clearance.

4. The substrate processing apparatus according to claim 1, further comprising
a supply unit for supplying an upper surface and a lower surface of said substrate with processing solution.

5. The substrate processing apparatus according to claim 1, wherein
said conductive member or said magnetic member has a portion opposed to one side of said group of induction coils and a portion opposed to the other side of said group of induction coils in a direction of said central axis.

6. The substrate processing apparatus according to claim 1, comprising
a plurality of pairs of said motor and said holding part which are so disposed as to be overlapped with one another in a direction of said central axis.

7. A substrate processing apparatus for processing a substrate, comprising:
a motor having a ring-shaped stationary part and a ring-shaped rotating part with a predetermined central axis as a center thereof, said rotating part rotating about said central axis; and
a holding part provided on said rotating part, for holding said substrate,
wherein said stationary part comprises:
a group of induction coils in a ring shape, for being supplied with multiphase alternating current;
a duct for cooling water provided along said group of induction coils,
a gas supply line for supplying gas between said rotating part and said stationary part; and a plurality of rotating members which rotate between said stationary part and said rotating part to make said rotating part rotatable with respect to said stationary part, and said rotating part has a conductive member or a magnetic member having an endring which gains a rotating force by traveling magnetic field caused along said group of induction coils; wherein said rotating part has an inner ring member whose section has a three-sided rectangular shape and opens outward from said central axis, a clearance is provided between inner surfaces including upper and lower surfaces near an inner side surface of said stationary part and surfaces of said inner ring member opposed to said inner surfaces, said gas supply line supplies gas from at least said inner side surface of said stationary part to said clearance, and said group of induction coils are located outside of said clearance with respect to said central axis.

8. The substrate processing apparatus according to claim 7, wherein
each of said plurality of rotating members is a rolling bearing receiving a radial load.

9. The substrate processing apparatus according to claim 7, further comprising
a supply unit for supplying an upper surface and a lower surface of said substrate with processing solution.

10. The substrate processing apparatus according to claim 7, wherein
said conductive member or said magnetic member has a portion opposed to one side of said group of induction coils and a portion opposed to the other side of said group of induction coils in a direction of said central axis.

11. The substrate processing apparatus according to claim 7, comprising
a plurality of pairs of said motor and said holding part which are so disposed as to be overlapped with one another in a direction of said central axis.

12. A substrate processing apparatus for processing a substrate, comprising:
a plurality of processing units,
wherein each of said plurality of processing units comprises:
a motor having a ring-shaped stationary part and a ring-shaped rotating part with a predetermined central axis as a center thereof, said rotating part rotating about said central axis; and
a holding part provided on said rotating part, for holding said substrate,
said stationary part comprises:
a group of induction coils in a ring shape, for being supplied with multiphase alternating current;
a duct for cooling water provided along said group of induction coils;
a gas supply line for supplying gas to a clearance between said stationary part and said rotating part to make said rotating part smoothly rotable with a mechanism of a static pressure gaseous bearing; and
a plurality of rotating members which rotate between said stationary part and said rotating part to make said rotating part rotatable with respect to said stationary part, and said rotating part has a conductive member or a magnetic member having an endring which gains a rotating force by a traveling magnetic field caused along said group of induction coils, said conductive member or said magnetic member has a portion opposed to one side of said group of induction coils and a portion opposed to the other side of said group of induction coils in a direction of said central axis, and said plurality of processing units are arranged so that at least part of adjacent ones are overlapped in a direction of said central axes of said motors; wherein said rotating part has an inner ring member whose section has a three-sided rectangular shape and opens outward from said central axis, said clearance is provided between inner surfaces including upper and lower surfaces near an inner side surface of said stationary part and surfaces of said inner ring member opposed to said inner surfaces, said gas supply line supplies gas from at least said inner side surface of said stationary part to said clearance, and said group of induction coils are located outside of said clearance with respect to said central axis.

13. The substrate processing apparatus according to claim 12, wherein each of said plurality of processing units further comprises a supply unit for supplying an upper surface and a lower surface of said substrate with processing solution.

14. The substrate processing apparatus according to claim 12, wherein said clearance corresponding to said mechanism of a static pressure gaseous bearing has a portion which is convex or concave towards said central axis.

15. The substrate processing apparatus according to claim 12, wherein said duct is provided between said group of induction coils and said clearance.

16. The substrate processing apparatus according to claim 12, wherein each of said plurality of rotating members is a rolling bearing receiving a radial load.

17. A substrate processing apparatus for processing a substrate comprising:

a motor having a ring-shaped stationary part and a ring-shaped rotating part with a predetermined central axis as a center thereof, said rotating part rotating about said central axis; and a holding part provided on said rotating part, for holding said substrate, wherein said stationary part comprises:

a group of induction coils in a ring shape, for being supplied with multiphase alternating current;

a duct for cooling water provided along said group of induction coils;

a gas supply line for supplying gas to a clearance between said stationary part and said rotating part to make said rotating part smoothly rotatable with a mechanism of a static pressure gaseous bearing; and a plurality of rotating members which rotate between said stationary part and said rotating part to make said rotating part rotatable with respect to said stationary part, and said rotating part has a conductive member or a magnetic member having an endring which gains a rotating force by a traveling magnetic field caused along said group of induction coils; and said conductive member or said magnetic member has a portion opposed to one side of said group of induction coils and a portion opposed to the other side of said group of induction coils in a direction of said central axis; wherein said rotating part has an inner ring member whose section has a three-sided rectangular shape and opens outward from said central axis, said clearance is provided between inner surfaces including upper and lower surfaces near an inner side surface of said stationary part and surfaces of said inner ring member opposed to said inner surfaces, said gas supply line supplies gas from at least said inner side surface of said stationary part to said clearance, and said group of induction coils are located outside of said clearance with respect to said central axis.

18. A substrate processing apparatus for processing a substrate, comprising:

a motor having a ring-shaped stationary part and a ring-shaped rotating part with a predetermined central axis as a center thereof, said rotating part rotating about said central axis; and a holding part provided on said rotating part, for holding said substrate, wherein said stationary part comprises:

a group of induction coils in a ring shape, for being supplied with multiphase alternating current;

a duct for cooling water provided along said group of induction coils; and a gas supply line for supplying gas to a clearance between said rotating part and said stationary part to make said rotating part smoothly rotatable with a mechanism of a static pressure gaseous bearing, said rotating part has a conductive member or a magnetic member having an endring which gains a rotating force by a traveling magnetic field caused along said group of induction coils, said rotating part has an inner ring member whose section has a three-sided rectangular shape and opens outward from said central axis, said clearance is provided between inner surfaces including upper and lower surfaces near an inner side surface of said stationary part and surfaces of said inner ring member opposed to said inner surfaces, said gas supply line supplies gas from at least said inner side surface of said stationary part to said clearance, and said group of induction coils are located outside of said clearance with respect to said central axis.

* * * * *